ABSTRACT

United States Patent [19]
Mochizuki et al.

[11] 3,984,739
[45] Oct. 5, 1976

[54] STRUCTURE FOR PACKAGING INTEGRATED CIRCUITS

[75] Inventors: Yoshifumi Mochizuki, Kodaira; Katsuhiko Komiyama, Tokyo; Satoshi Kimura, Tokorozawa, all of Japan

[73] Assignee: Citizen Watch Co., Ltd., Tokyo, Japan

[22] Filed: Apr. 11, 1975

[21] Appl. No.: 567,418

[30] Foreign Application Priority Data
Apr. 18, 1974  Japan .............................. 49-043980

[52] U.S. Cl. ...................... 317/101 CP; 174/52 FP
[51] Int. Cl.² ............................................. H05K 5/00
[58] Field of Search .......... 174/52 S, 52 PE, 52 FP; 317/101 F, 101 CP; 29/626, 628, 588–591; 357/70

[56] References Cited
UNITED STATES PATENTS

| 3,684,818 | 8/1972  | Netherwood ............. 317/101 CP X |
| 3,763,404 | 10/1973 | Aird .................. 174/52 PE |
| 3,793,714 | 2/1974  | Bylander .......................... 357/72 U |
| 3,868,725 | 2/1975  | Degraaff ..................... 174/52 FP X |
| 3,909,838 | 9/1975  | Beyerlein .......................... 357/72 X |

Primary Examiner—J. V. Trohe
Assistant Examiner—D. A. Tone
Attorney, Agent, or Firm—Spensley, Horn and Lubitz

[57] ABSTRACT

An integrated circuit package structure wherein electrodes of an integrated circiut chip are directly bonded to metal lead members within the package. A portion of the substrate is enclosed inside the package to support the package. Holes are provided on the substrate for positioning and securing the package to the substrate. The substrate has a generally rectangular opening disposed therethrough arranged and configured to receive an integrated circuit chip and at least two additional openings disposed in said substrate so as to form at least two support arms adjacent to the rectangular opening. The integrated circuit package has a top member, a bottom member and a circuit chip. The circuit chip has a plurality of electrodes disposed thereon in a predetermined configuration for selectively coupling the lead members which are disposed on the substrate. By the use of the integrated circuit package structure of the present invention, circuit packages may be securely and easily coupled to a substrate and held in position.

12 Claims, 3 Drawing Figures

STRUCTURE FOR PACKAGING INTEGRATED CIRCUITS

BACKGROUND OF THE INVENTION

1. Field of the Invention

The present invention relates to a structure for coupling integrated circuit packages to a substrate.

2. Prior Art

In recent years integrated circuits of increasing complexity have become commercially available in large quantities with the costs of such circuits in the unpackaged chip form becoming lower and lower. Unfortunately, this has lead to poor quality control and inaccurate positioning of the package on the substrate. Moreover, because of the requirements that each package have a specific capability, a plurality of tasks must be performed on each package in order to assure that such package has the proper characteristics.

Packaging of semiconductor devices involves the handling and processing of individual integrated circuits after dicing. Thus, each circuit must be handled individually, each must be accurately located with respect to the package, each of the required contexts or connections between the chip and the package leads must be made, and the package must be satisfactorily sealed against moisture and other contaminants. Accordingly, it is not unusual for the costs of such packages to be in the order of the cost of semiconductor device to be packaged therein, and in many cases it is even greater than the device to be packaged.

Packages of the type commonly referred to as plastic flat packs have come into wide-spread use, particularly in commercial applications. Such packages are characterized by a generally rectangular, relatively thin plastic body with a plurality of leads projecting out of each side and then downward so that the device may be either plugged into a cooperatively disposed socket for such a device, or soldered directly into a printed socket board adapted to receive the device. The plastic packages of the prior art generally dispose the top surface of a semiconductor chip below the plane of the top surface of the spider conductors, so that both the semiconductor surface and the lead frame surface cannot be maintained in focus under a microscope at the same time, and coupling of the wires are longer than necessary. In addition, fabrication and assembly are more difficult in these prior art packages and time consuming.

The prior art method of packaging integrated circuits, in which an integrated circuit chip is first bonded directly to a lead frame etched over a plastic film opening and then packaged, generally entails (i) placing the package inside the opening, (ii) etching away the lead frame inside the opening, and (iii) fixing the lead frame directly to the circuit base. After the package is cut away from the plastic film and fixed to the circuit base, the package is held only by the thin lead frame made of thin layers of metal. For this reason, the lead frame cannot provide sufficient support for the package which is led to bends or breaking off of the leads adding to the difficulty of packaging operations inside the opening. In addition, prior art packaging structures provide no means for positioning or securing the package to the circuit base or substrate.

BRIEF SUMMARY OF THE INVENTION

An improved integrated circuit package structure comprising the substrate having an opening disposed therethrough for receiving an integrated circuit chip and a plurality of support arms disposed thereon adjacent to the opening capable of receiving and accurately and securely positioning the integrated circuit package is disclosed. The substrate has a generally rectangular opening disposed therethrough arranged and configured to receive an integrated circuit chip and at least two additional openings disposed in said substrate so as to form at least two support arms adjacent said rectangular opening. An integrated circuit package is coupled to the substrate so as to sandwich the substrate thereinbetween. The circuit package has a top or cover member having outwardly extending ledge members adapted to engage and position the top member on the substrate, and the bottom member. The bottom member also has outwardly extending ledge members arranged and configured so as to engage the arm members when the bottom members couple to the substrate. The bottom member also has disposed therein a generally hollow interior for receiving an integrated circuit chip, or other well known electronic device. The bottom member positions the circuit chip such that when the bottom member of the package is coupled to the substrate, the circuit chip is disposed such that electrodes on the top of the circuit chip lie in approximately the same plane as the top of the substrate. This enables the various metal lead members disposed on the surface of the substrate to be easily coupled to the electrodes on the surface of the chip without the requirement that the leads be bent in a generally downward direction.

It is therefore one object of the present invention to provide an integrated circuit packaging structure having reinforcing means to support the package when the package is fixed to a circuit base.

Another object of the present invention is to provide an integrated circuit packaging structure having means to position and secure the package to the circuit base.

The novel features which are believed to be characteristic of the invention, both as to its organization and method of operation, together with further objectives and advantages thereof, will be better understood from the following description considered in connection with the accompanying drawings in which a presently preferred embodiment of the invention is illustrated by way of example. It is to be expressly understood, however, that the drawings are for the purpose of illustration and description only, and are not intended as a definition of the limits of the invention.

DETAILED DESCRIPTION OF THE INVENTION

Figure 1:
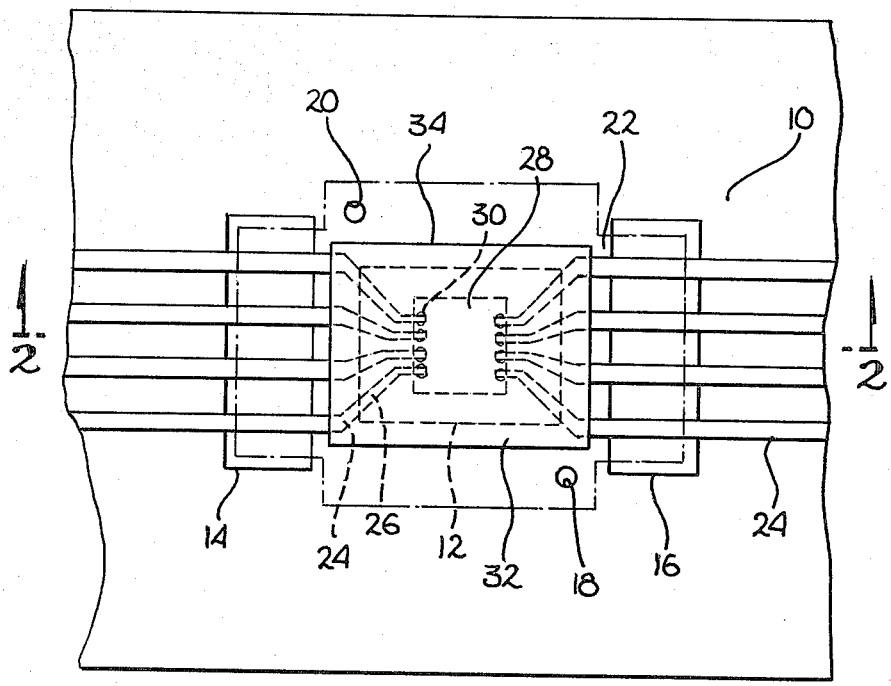
FIG. 1 is a top plan view of the substrate showing the top member of the integrated circuit package and the various supporting arm members.

Referring first to FIG. 1, a plan view of a typical integrated circuit package and substrate which may be fabricated in accordance with the present invention may be seen. A plastic film or substrate 10 having openings 12, 14 and 16 is shown with the leads 24 entering the opposite sides of the package 32. The top or cover 34 is of a generally rectangular configuration terminating at the bottom thereof in an outwardly extending ledge member 36. To better illustrate the interior of the package, and the various holes disposed in the substrate 10, ledge members 36 are shown in phantom lines. The top 34 is arranged and configured so as to be disposed over the opening 12 with two flange members extending partially over openings 14 and 16 and two flange members extending over mating holes 18 and 20. Openings 14 and 16 are disposed through the plastic substrate 10 adjacent to opposite sides of the generally rectangular opening 12 so as to form supporting arms 22 on each side thereof. Support arms 22 help support the top of the receptacle on the substrate as well as the leads 24 upon their entry into the opening 12. In a preferred embodiment, arms 22 are disposed in a generally parallel spaced apart configuration at opposite sides of the generally rectangular opening 12. Of course, other configurations are within the scope of this invention. Disposed through some of the ledge members 36 are holes 18 and 20. Holes 18 and 20 are positioned on ledge members 36 so as to engage protuberances disposed on the substrate 10. Other means, such as, for example, pin members, screw members, bolt members, etc. may be used to securely and accurately position the package top 34 to the substrate 10.

Cutting away the top of the package 34 from the plastic substrate 10, the openings 14 and 16 would expose a rim left from the lead 24 without the plastic film backing for joining to a circuit base (not shown).

Figure 2:
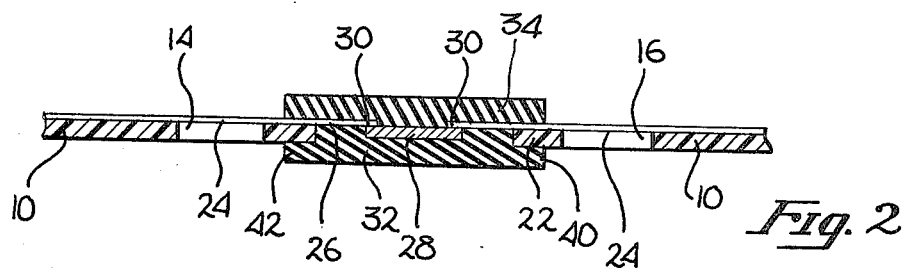
FIG. 2 is a cross-section of the plastic package and substrate taken along lines 2—2 of FIG. 1.

Referring now to FIG. 2, one can see that inside of opening 12, the lower, or bottom member 40 of the integrated circuit package 32 is arranged and configured such that it also has, at the bottom thereof, outwardly extending ledge members 42. Ledge members 42 are arranged and configured so as to couple or selectively interlock with the arm members 22 of the substrate 10 such that the bottom member is journaled between the arm members. Bottom member 40 has a cavity disposed therein with the electronic chip 28 or other well known electronic devices mounted in the cavity.

Figure 3:
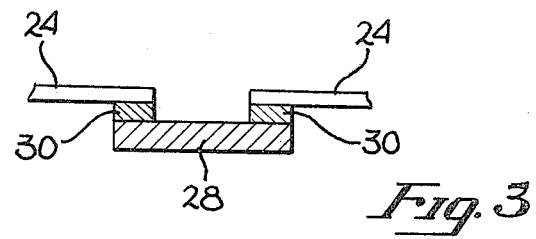
FIG. 3 is an enlarged plan view of the section of FIG. 2 showing the lead members coupled to the electrodes disposed on the top or upper surface of the integrated chip.

Referring again to FIG. 2, one can see that the circuit chip 28 is arranged and configured in the bottom 40 of the package 32 such that electrodes 30 disposed on its surface are in a generally parallel plane with respect to the top of the substrate 10. This enables the leads 24 to be easily coupled to the electrodes 30 as shown in FIG. 3. In the presently preferred embodiment, the underneath section of each of the leads is electrically coupled to the electrodes 30 without the need for bending the electrodes either upward or downward. This prevents these relatively delicate electrodes from breaking or shearing off or being weakened.

Another advantage associated with the support arms 22 is that the leads 24 are reinforced in this area and in effect hold the package 32 more securely in place. Furthermore, because of the openings 14 and 16 it is relatively easy to couple various other leads or electrical hook-ups to the now exposed leads 24. Handling of the package is also made easier because the top and bottom of the package is securely held in position.

There has been described a unique electronic package which provides for easy, yet secure coupling to a substrate such as is well known in the art. It will be understood by those skilled in the art that other embodiments may be made without departing from the spirit and scope of the invention.

We claim:

1. An integrated circuit package structure comprising:
    a substrate having a substantially rectangular opening disposed therethrough, said substrate having at least two additional openings disposed in said substrate so as to form at least two support arms adjacent said rectangular opening;
    an integrated circuit chip, said chip having a plurality of electrodes disposed thereon in a predetermined pattern;
    a bottom member, said bottom member including means receiving and positioning said circuit chip in said rectangular opening such that said electrodes on said chip are substantially coplanar with the top surface of said substrate, said bottom member further being coupled to the bottom surface of said substrate;
    a top member being coupled to the top surface of said substrate thereby forming a package; and
    a plurality of electrically conductive leads disposed on said substrate and extending into said rectangular opening, said leads being clamped between said bottom and top members and having one end thereof electrically coupled to said electrodes on said chip, said leads further extending along said substrate over said support arms.

2. The package structure of claim 1 wherein said top member and bottom member of said package have means securing and positioning said members to said substrate.

3. The package structure of claim 2 wherein said means includes pin members.

4. The package structure of claim 1 wherein said bottom member of said package has outwardly extending ledge members, said ledge members engaging said support arms whereby said package is securely positioned on said substrate.

5. The package structure of claim 1 wherein said top member of said package has outwardly extending ledge members, said ledge members securing said top member to said substrate.

6. The package structure of claim 5 wherein said ledge members are disposed over said arm members thereby sandwiching said leads thereinbetween.

7. An integrated circuit package structure comprising a substrate;
    a first rectangular opening in said substrate;
    at least two second rectangular openings in said substrate, said second openings disposed adjacent each side of said first opening and forming support arms;
    an integrated circuit chip having a plurality of electrodes disposed thereon in a predetermined pattern, said circuit chip being substantially smaller than said substrate;
    a bottom member, said bottom member including means receiving and positioning said circuit chip in said first opening such that said electrodes on said chip are substantially coplanar with the top surface of said substrate, said bottom member being further coupled to the bottom surface of said substrate;

a top member being coupled to the top surface of said substrate thereby forming a package; and a plurality of electrically conductive leads disposed on said substrate, said leads extending along the top surface of said substrate and over said second rectangular openings and into said first rectangular opening, said leads further being clamped between said top and bottom members and having one end thereof electrically coupled to said electrodes on said chip.

8. The package structure of claim 7 wherein said bottom member of said package has outwardly extending ledge members, said ledge members engaging said support arms whereby said package is securely positioned on said substrate.

9. The package structure of claim 8 wherein said top member of said package has outwardly extending ledge members, said ledge members securing said top member to said substrate.

10. The package structure of claim 9 wherein said top member and bottom member of said package have means securing and positioning said members to said substrate.

11. The package structure of claim 9 wherein said means securing and positioning said members to said substrate comprises screw means.

12. A package structure according to claim 7 wherein said substrate is made from a thin film like plastic.

* * * * *